US012733115B2

(12) United States Patent
Jang

(10) Patent No.: US 12,733,115 B2
(45) Date of Patent: Sep. 8, 2026

(54) FLEXIBLE DISPLAY DEVICE FOR A VEHICLE

(71) Applicant: HYUNDAI MOBIS CO., LTD., Seoul (KR)

(72) Inventor: Kil Pyung Jang, Seoul (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 340 days.

(21) Appl. No.: 18/338,768

(22) Filed: Jun. 21, 2023

(65) Prior Publication Data

US 2024/0049411 A1 Feb. 8, 2024

(30) Foreign Application Priority Data

Aug. 2, 2022 (KR) ........................ 10-2022-0096369

(51) Int. Cl.

| | |
|---|---|
| ***H05K 5/02*** | (2006.01) |
| ***H10K 77/10*** | (2023.01) |
| *B60K 35/00* | (2006.01) |
| *B60K 35/22* | (2024.01) |
| *B60K 35/53* | (2024.01) |
| *H10K 102/00* | (2023.01) |

(52) U.S. Cl.

CPC ......... *H05K 5/0217* (2013.01); *H10K 77/111* (2023.02); *B60K 35/00* (2013.01); *B60K 35/22* (2024.01); *B60K 35/53* (2024.01); *H10K 2102/311* (2023.02)

(58) Field of Classification Search

USPC ......................................... 361/807, 809, 810

See application file for complete search history.

(56) References Cited

U.S. PATENT DOCUMENTS

| | | | | |
|---|---|---|---|---|
| 2013/0271940 | A1* | 10/2013 | Cope | H04N 5/64 361/809 |
| 2016/0299531 | A1 | 10/2016 | Vertegaal | |
| 2016/0374228 | A1* | 12/2016 | Park | G09F 9/301 |
| 2017/0140504 | A1* | 5/2017 | Jeong | G06F 3/147 |
| 2018/0160554 | A1 | 6/2018 | Kang et al. | |
| 2019/0198783 | A1* | 6/2019 | Kim | H10H 20/855 |
| 2021/0124400 | A1 | 4/2021 | Pyo | |
| 2021/0204427 | A1 | 7/2021 | Pyo | |
| 2021/0208552 | A1* | 7/2021 | Choi | G06F 1/1656 |
| 2022/0001745 | A1 | 1/2022 | Wall | |

FOREIGN PATENT DOCUMENTS

KR 10-0821925 B1 4/2008

OTHER PUBLICATIONS

Extended European Search Report issued Jan. 25, 2024, for European Patent Application No. 23179985.9 (9 pages).

* cited by examiner

*Primary Examiner* — Hung S. Bui

(74) *Attorney, Agent, or Firm* — NovoTechIP International PLLC

(57) ABSTRACT

A flexible display device for a vehicle includes a casing having an opening, a display part to be retracted or extended into or out of the casing through the opening, a display driver configured to move the display part, and a display winder configured to wind the display part based on movement of the display part.

17 Claims, 30 Drawing Sheets

FLEXIBLE DISPLAY DEVICE FOR A VEHICLE

CROSS-REFERENCE TO RELATED APPLICATIONS

Pursuant to 35 U.S.C. § 119(a), this application claims the benefit of earlier filing date and right of priority to Korean Application No. 10-2022-0096369, filed on Aug. 2, 2022, the contents of which are hereby incorporated by reference herein in its entirety.

TECHNICAL FIELD

The present embodiments relate to a flexible display device for a vehicle, to be applicable to vehicles in all fields, and more particularly to a device for retracting or extending (hereinafter referred to as 'retracting or extending') a flexible display to be bent or folded.

BACKGROUND

A center fascia display of a vehicle may display various visual information about the vehicle. Such a display device may also be installed on a dashboard of a vehicle disposed in front of a driver's seat and a front passenger seat, and provides various convenience information such as navigation, vehicle management and operation, Internet, and entertainment.

In this regard, there is a movable display device, and the movable display device is capable of moving up and down or left and right relative to a dashboard. As the display moves along a guide, a driver and a passenger may selectively use the display. In the case of a display in the form of a pop-up, the display may be stored and then extended and used when necessary.

Since an installation position of a fixed display is fixed, the use of space in a vehicle is limited, and as a display size increases, the forward visibility decreases. A pop-up style movable display requires a separate accommodation space for the display, and as the size of the display increases, the size of the accommodation space also increases, limiting the utilization of space in the vehicle. In addition, since an entire screen is operated in an LCD screen display, inefficiency in that all power is used regardless of a degree of exposure of the display remains.

Therefore, it is required to develop a display device having a form and structure for multiplying advantages while minimizing these disadvantages. Background art related to this may be referred to Patent No. 10-0821925 ('display driving device').

SUMMARY

An object of the embodiments of the present disclosure is to provide a display device for reducing the size of an accommodation space of a display used in a vehicle.

An object of the present disclosure is to provide a display device for efficiently retracting or extending a display used in a vehicle from an accommodation space.

An object of embodiments of the present disclosure is to provide a display device for controlling a degree of exposure of a display according to a purpose of using a display.

In addition, an object of embodiments of the present disclosure is to provide a display device for saving power for outputting a display image.

It will be appreciated by one of ordinary skill in the art that the objects that could be achieved with the present disclosure are not limited to what has been particularly described hereinabove and the above and other objects that the present disclosure could achieve will be more clearly understood from the following detailed description.

According to any one of embodiments of the present disclosure, a flexible display device for a vehicle includes a casing having an opening, a display part to be retracted or extended into or out of the casing through the opening, a display driver configured to move the display part, and a display winder configured to wind the display part based on movement of the display part, wherein the display part includes a rotary drum having an outer circumferential surface on which the display part is to be wound The display part may include a sensor recognizer configured to detect a rotation state of the rotary drum.

The sensor recognizer may include a plurality of sensors located inside the casing, and a detection part connected to the rotary drum and detected by the plurality of sensors, and the detection part may have a shape for any one of the plurality of sensors to detect a different state from remaining sensors according to the rotation state of the rotary drum.

Each of the sensors may include a photo sensor, the detection part may include one hole, and the hole may be located in a recognition region of any one of the plurality of sensors according to the rotation state of the rotary drum.

The rotary drum may include a rotary spring, and the rotary spring may apply a force in a direction in which the display part is wound.

In the display part, an exposure range of a display may be controlled based on the rotation state of the rotary drum, detected by the sensor recognizer.

The display part may include a flexible display, and a display cover adhered to a rear surface of the display.

The display part may further include a flexible connecting sheet having one side connected to the display and a remaining side connected to the display winder, and the connecting sheet may be wound by the display winder.

The flexible display device may further include a guide part connected to an inside of the casing and configured to guide movement of the display part, and the guide part may perform guidance to have a curvature radius of a path along which the display part moves, in a range of 30 mm to 70 mm.

The display may be a plastic organic light-emitting diode (POLED).

The guide part may include a curvature guide configured to guide a movement path in which the curvature radius is formed, and the curvature guide may include a front curvature guide in contact with a front surface of the display part, and a rear curvature guide in contact with a rear surface of the display part.

The front curvature guide and the rear curvature guide may include a plurality of rollers.

The display driver may include a motor connected to an inside of the casing, a worm gear part connected to the motor and having a rotation shaft parallel to the motor, and a worm wheel part connected to the worm gear part and having a rotation shaft perpendicular to the motor, and the display driver may move the display part by rotation of the motor.

The display driver may include a first driving arm having a first end connected to the worm wheel part and a second end connected to the display part, and pivoted by the worm wheel part.

The display driver may further include a second driving arm having a first end connected to the second end of the first driving arm and a second end connected to the display part, pivoting on the same plane as a pivoting plane of the first driving arm, and pivoting in an opposite direction to a pivoting direction of the first driving arm.

The display part may further include an upper fixing plate in surface contact with a partial region of a rear surface of an upper end of the display, the upper fixing plate may include a guide configured to guide the first driving arm or the second driving arm, and a width of the upper fixing plate may be at least equal to or greater than a width of the display.

In the display driver, an operation of the motor may be controlled based on the rotation state of the rotary drum, recognized by the sensor recognizer.

The flexible display device may further include a rear protection cover attached to and detached from a rear surface of the display part and configured to cover an exposed rear surface of the display part.

The display part and the rear protection cover may include a plurality of magnets provided at related positions in a vertical direction, and the rear protection cover may be attached to and detached from the display part by a magnet.

The rear protection cover may be separated from the display part while being retracted into the casing.

According to any one of embodiments of the present disclosure, a flexible display device for a vehicle includes a casing having an opening, a display part to be retracted or extended into or out of the casing through the opening, a display driver configured to move the display part, and a display winder configured to wind the display part based on movement of the display part, wherein the display part includes a flexible plastic organic light-emitting diode (POLED) display, and the display winder includes a rotary drum having an outer circumferential surface on which the display part is to be wound and a sensor recognizer configured to detect a rotation state of the rotary drum.

According to any one of embodiments of the present disclosure, in a flexible display device for a vehicle, a flexible plastic organic light-emitting diode (POLED) display is retracted into a casing or extended out of the casing by winding or unwinding the display on an outer circumferential surface of a rotary drum.

BRIEF DESCRIPTION OF THE DRAWINGS

FIG. 19 is an exploded view of a rear cover part of a flexible display device for a vehicle according to another embodiment of the present disclosure.

DETAILED DESCRIPTION

Figure 1:
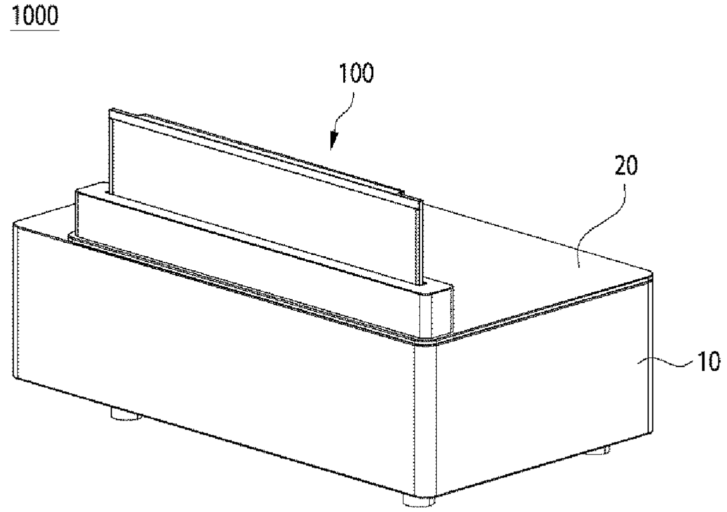
FIG. 1 is a perspective view of a flexible display device for a vehicle according to an embodiment of the present disclosure.

Advantages and features of the present disclosure, and methods of achieving them may be clear with reference to the detailed description of the following embodiments taken in conjunction with the accompanying drawings. However, the present disclosure is not limited to the embodiments disclosed below, but may be implemented in various different forms, only these embodiments are intended to complete the disclosure of the present disclosure, and are common in the art to which the present disclosure belongs. It is provided to fully inform one of ordinary skill in the art of the scope of the present disclosure, and the present disclosure is only defined by the scope of the claims.

Terminology used herein is for describing the embodiments and is not intended to limit the present disclosure. In this specification, singular forms also include plural forms unless specifically stated otherwise in a phrase. As used herein, “comprises” and/or “comprising” does not exclude the presence or addition of one or more other elements other than the recited elements. Like reference numerals throughout the specification refer to like elements, and “and/or” includes each and every combination of one or more of the recited elements. Although “first”, “second”, etc. are used to describe various components, these components are not limited by these terms, of course. These terms are only used to distinguish one component from another. Accordingly, it goes without saying that the first element mentioned below may also be the second element within the technical spirit of the present disclosure.

Unless otherwise defined, all terms (including technical and scientific terms) used in this specification may be used with meanings commonly understood by one of ordinary skill in the art to which the present disclosure pertains. In addition, terms defined in commonly used dictionaries are not interpreted ideally or excessively unless explicitly specifically defined.

The spatially relative terms “below”, “beneath”, “lower”, “above”, “upper”, etc. may be used to easily describe a component's correlation with other components. Spatially relative terms should be understood as including different orientations of elements in use or operation in addition to the orientations shown in the drawings. For example, if a component that is shown in a drawing is inverted, a component described as “below” or “beneath” another component may be placed “above” the other component. Thus, the exemplary term “below” may include directions of both below and above. Components may also be oriented in other orientations, and thus spatially relative terms may be interpreted according to orientation.

Figure 2:
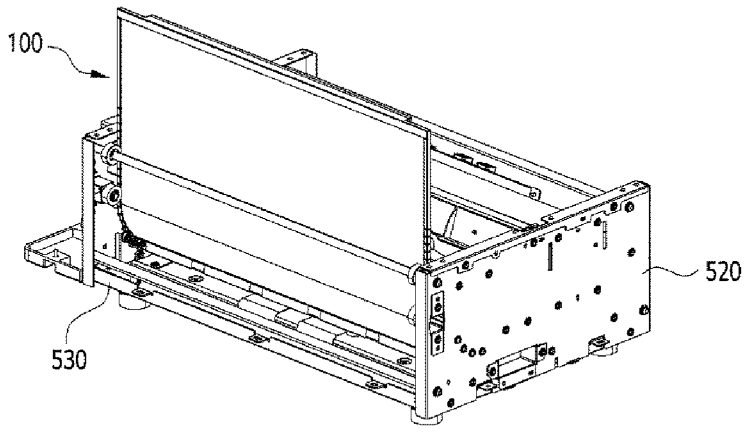
FIG. 2 is a front perspective view showing the inside of a flexible display device for a vehicle according to an embodiment of the present disclosure.

FIG. 1 is a perspective view of a flexible display device for a vehicle (hereinafter referred to as a ‘display device’) 1000 according to the present embodiment. FIG. 2 is a front perspective view showing the inside of the display device 1000. FIG. 2 shows the display device 1000 in a state in which a side casing 10 and an upper casing 20 are excluded from FIG. 1.

Figure 3A:
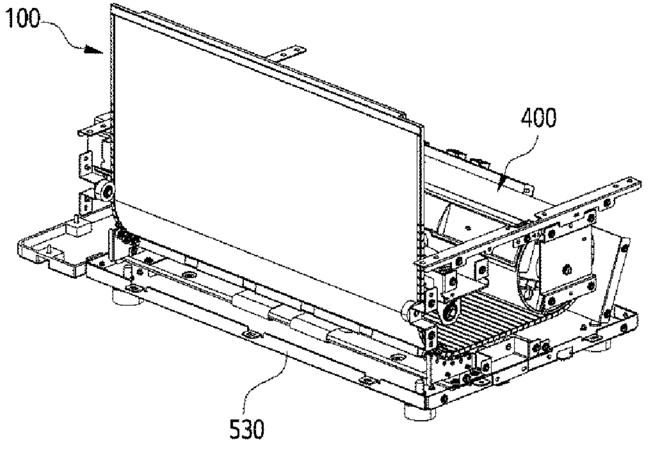
FIG. 3A is a front perspective view showing the inside of a flexible display device for a vehicle according to an embodiment of the present disclosure.
Figure 3B:
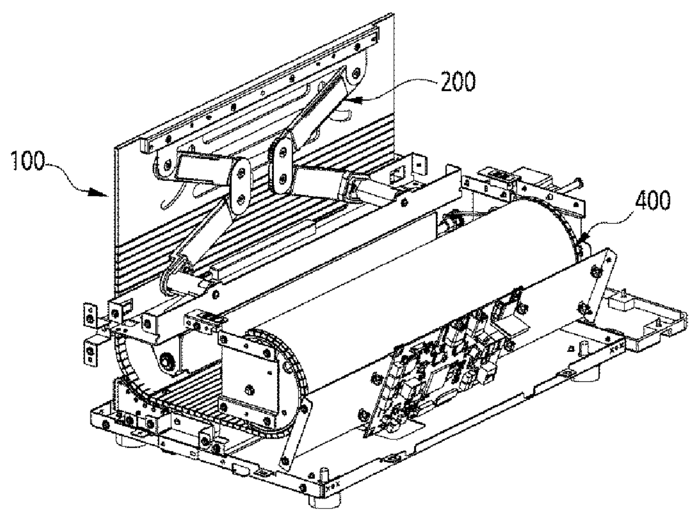
FIG. 3B is a rear perspective view showing the inside of a flexible display device for a vehicle according to an embodiment of the present disclosure.

FIGS. 3A and 3B are a front perspective view and a rear perspective view showing the inside of the display device 1000. FIGS. 3A and 3B show the display device 1000 except for a side fixing frame 520 in FIG. 2.

FIGS. 4A to 4D are a front perspective view and a rear perspective view showing the inside of the display device 1000. FIGS. 4A to 4D show a state of the display device 1000 except for a bracket (or frame), a screw, a clip, a rod (or bar), etc. for fixing a bottom fixing frame 530 and other parts in FIGS. 3A and 3B.

In the drawings, some components may be omitted to describe components located inside the casing of the display device 1000, and each diagram may represent a flexible display device for a vehicle according to embodiments of the present disclosure.

Referring to FIGS. 1 to 4 (4A to 4D), the display device 1000 may include a casing having an opening, a display part 100 to be retracted or extended into or out of the casing through the opening, a display driver 200 for moving the display part 100, a guide part 300 for guiding the display part 100, and a display winder 400 for winding and unwinding the display part 100.

The casing may include the side casing 10 and the upper casing 20, and the side casing 10 and the upper casing 20 may be assembled together. In addition, the casing may include an inner space, and thus other components may be placed in the inner space of the casing. The casing may include an opening, and the opening may be formed in a size for the display part 100 to be retracted or extended (hereinafter referred to as ‘retracted or extended’) into or out of the casing. The casing may protect the components located in the inner space and improve the appearance of the device. The shape of the casing is not limited to that shown in the drawings, and one of ordinary skill in the art to which the present disclosure pertains (hereinafter referred to as ‘one of ordinary skill in the art’) may appropriately change within the scope of the technical idea of the present disclosure.

The display part 100 may include components related to a display screen displaying various vehicle-related information. For example, the display part 100 may include a display 110, a connecting sheet 120, and a display cover 130.

Figure 5:
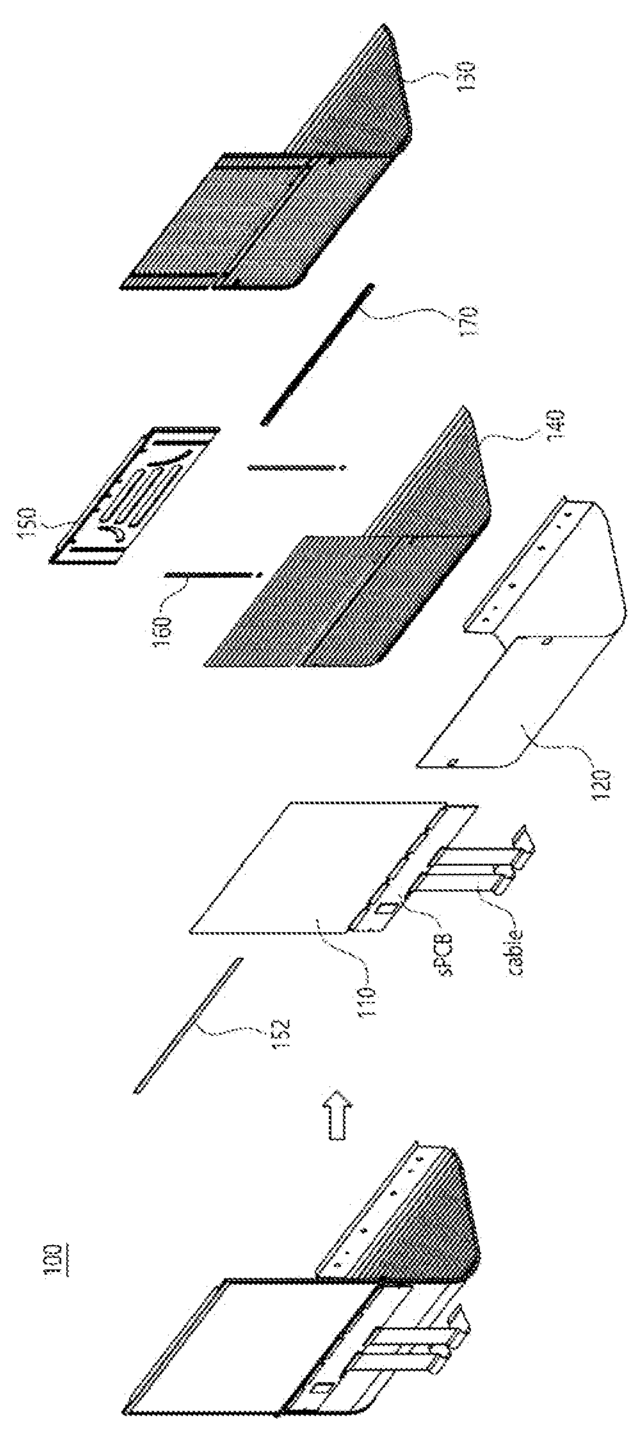
FIG. 5 is an exploded view of a display part of a display device.

FIG. 5 is an exploded view of the display part 100 of the display device 1000, and shows components of the display part 100.

The display 110 may be a flexible or rollable display 110. The display 110 may be a plastic organic light-emitting diode (POLED). The POLED is an OLED applied with a polyimide (PI) substrate, a type of plastic, and may be implemented with a curved surface.

The display 110 may be bent, and a curvature radius at which the display 110 is bent may be at least 50 mm or more. In detail, the radius of curvature of the display 110 may be at least 30 mm or more. The display 110 may include a light emitting diode (LED), an OLED, an AMOLED, and a PMOLED. The width and height of the display 110 may be appropriately designed by one of ordinary skill in the art.

The connecting sheet 120 may have one side connected to a lower end of the display 110 and the other side connected to the display winder 400. In addition, the connecting sheet 120 may be flexible and may be wound or unwound through the display winder 400. One side of the connecting sheet 120 may be attached to the display 110 using a double-sided tape. The connecting sheet 120 may include a sheet formed of a PET material. The material of the connecting sheet 120 may be appropriately selected by one of ordinary skill in the art in consideration of flexibility.

The display 110 and the connecting sheet 120 may be connected, and the connecting sheet 120 may be wound or unwound by the display winder 400. Therefore, when the display 110 is retracted into a casing, the display winder 400 may wind the connecting sheet 120, and when the display 110 is extended out of the casing, the display winder 400 may unwind the connecting sheet 120.

The display cover 130 may be a cover protecting rear surfaces of the display 110 and the connecting sheet 120. The display cover 130 may supplement the display 110 and the connecting sheet 120, which do not have rigidity. The display cover 130 may include a plurality of covers that are long in a horizontal direction and short in a vertical direction. The plurality of covers may be adhered to the rear surface of the display 110 or the rear surface of the connecting sheet 120 through a double-sided adhesive 140. The double-sided adhesive 140 may include a double-sided tape such as a FOAM tape. The double-sided adhesive 140 may be separately applied to the plurality of covers of the display cover 130. The widths of the plurality of covers of the display cover 130 may be greater than or equal to the width of the display 110. The heights of the plurality of covers may be appropriately designed by one of ordinary skill in the art in consideration of whether to flexibly respond to bending of the display 110.

The display cover 130 may further include a magnetism part 160 at both ends in a horizontal direction. The magnetism part 160 may utilize a magnetic force for attachment to and detachment from a rear protection cover 2210 (refer to FIG. 18) to be described later. For example, an externally exposed portion of the display part 100 may be protected by attaching the rear protection cover 2210 (refer to FIG. 18), and an inner portion of the casing of the display part 100 may be separated from the rear protection cover 2210 (refer to FIG. 18).

The display part 100 may further include an upper fixing plate 150, a top fixing clip 152, and a connection reinforcing part 170.

The upper fixing plate 150 may be a flat plate in surface contact with a part of an upper end of the rear surface of the display 110. A width of the upper fixing plate 150 may be at least equal to or greater than a width of the display 110. The top fixing clip 152 may be connected to the upper fixing plate 150 at an upper end of a front surface of the display 110. An upper end of the display 110 may be fixed by connecting the top fixing clip 152 and the upper fixing plate 150. The upper fixing plate 150 and the top fixing clip 152 may protect the upper end of the flexible display 110, and the upper fixing plate 150 may be connected to the display driver 200 to be described later to receive power of a motor. In addition, the upper fixing plate 150 and the top fixing clip 152 may improve the appearance of the display device.

The material of the upper fixing plate 150 and the top fixing clip 152 includes aluminum (AL), and other materials having appropriate rigidity may be applied thereto by one of ordinary skill in the art.

The connection reinforcing part 170 is a component for overcoming the vulnerability of a connection part between the display 110 and an sPCB.

Figure 6:
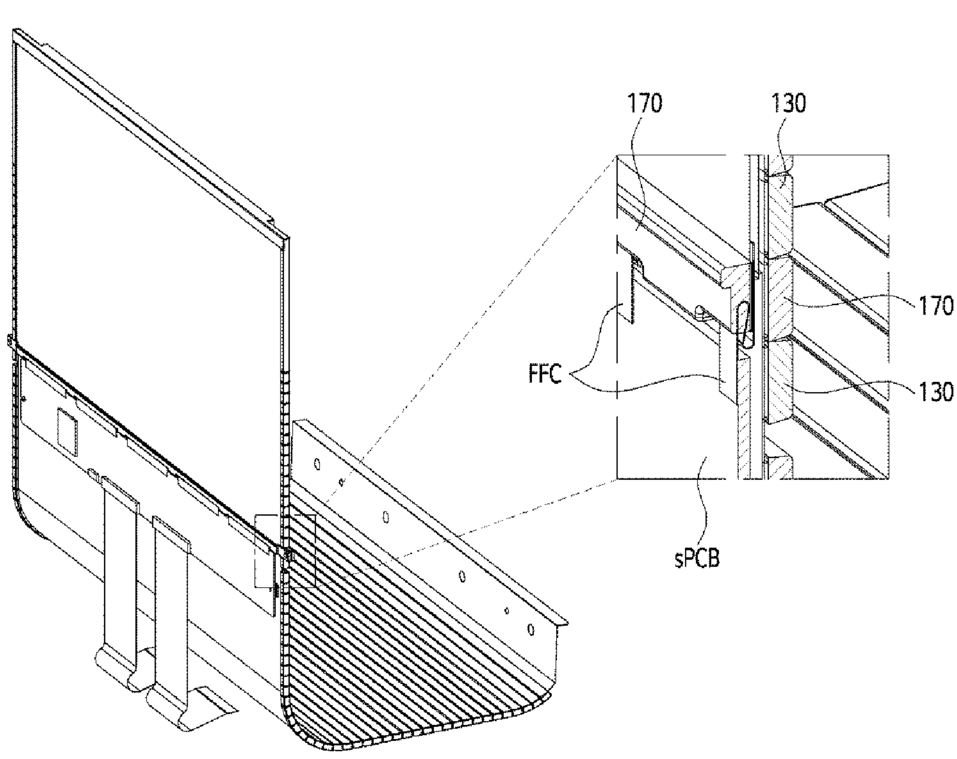
FIG. 6 is an enlarged view of a connection portion of a display part of a display device.

FIG. 6 is an enlarged view of a lower connection portion of the display 110 to explain the connection reinforcing part 170.

The display 110 may be connected to a sPCB through a flexible flat cable (FFC), and the FFC may be damaged by an external force when the display 110 is moved. Therefore, the connection reinforcing part 170 may protect the FFC by fixing the FFC on front and rear surfaces of the display 110 or the connecting sheet 120. In the connection reinforcing part 170, two members having a length in a horizontal direction may be coupled to each other at the front and rear surfaces of the display 110 with the display 110 therebetween. By coupling the two members, the FFC may be fixed, and may be maintained in a shape that is not subjected to an external force. Coupling of the two members may be performed through a double-sided tape or screw fastening.

The display 110 may be connected to an sPCB and a cPCB, and final control may be performed by a main PCB.

The display driver 200 is a component moving the display part 100.

Figure 7:
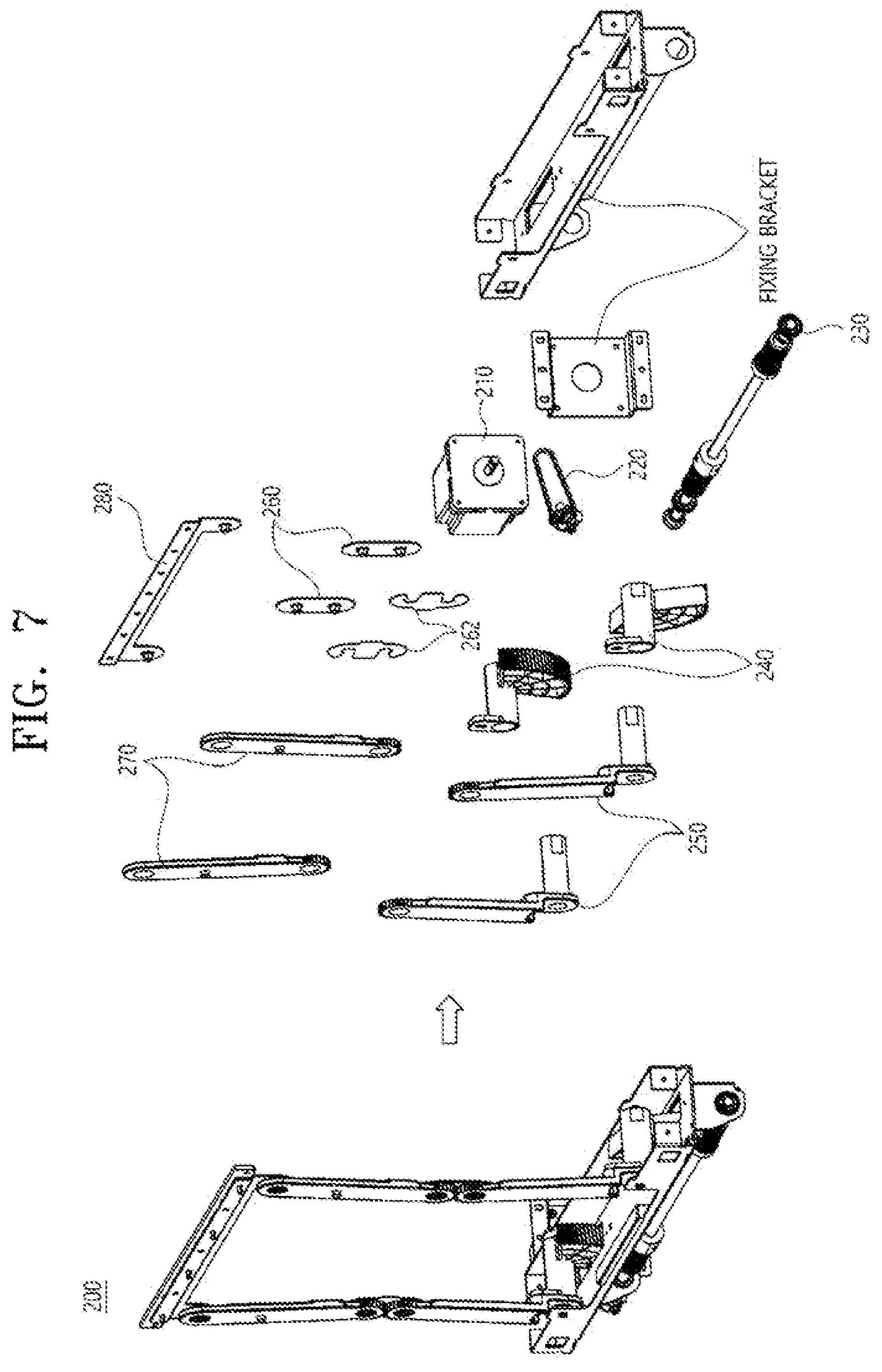
FIG. 7 is an exploded view of a display driver of a display device.

FIG. 7 is an exploded view of the display driver 200. The configuration of the display driver 200 may be referred to FIGS. 4C and 4D.

The display driver 200 may include a motor 210 connected to the inside of a casing, a worm gear part 230 connected to the motor 210, a worm wheel part 240 connected to the worm gear part 230, a first driving arm 250 connected to the worm wheel part 240, and a second driving arm 270 connected to the first driving arm 250.

Rotation of the motor 210 may be controlled by a controller (not shown). For example, an operation of the motor 210 may be controlled to appropriately retract or extend the display part 100. The display part 100 may have different levels of exposure extended to the outside of the casing depending on an exposure mode, and the motor 210 may adjust an exposure range of the display part 100 by controlling an operation according to an exposure mode selected by a user. The motor 210 may be a stepping or hybrid motor.

The worm gear part 230 may include a rod rotating on a rotation shaft parallel to the motor 210 and a worm gear connected to the rod. The worm gear part 230 may rotate by rotation of the motor 210, and may be connected to the motor 210 through a timing belt 220 and may operate.

Figure 9:
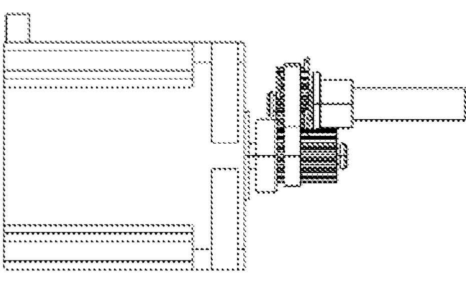
FIG. 9 illustrates a motor connection portion of a display driver.
Figure 9:
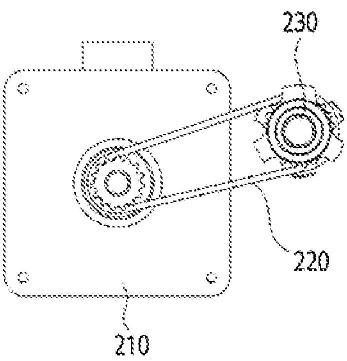

FIG. 9 illustrates a connection portion of the motor 210 of the display driver 200. The motor 210 may rotate the rod of the worm gear part 230 using the timing belt 220.

Figure 4A:
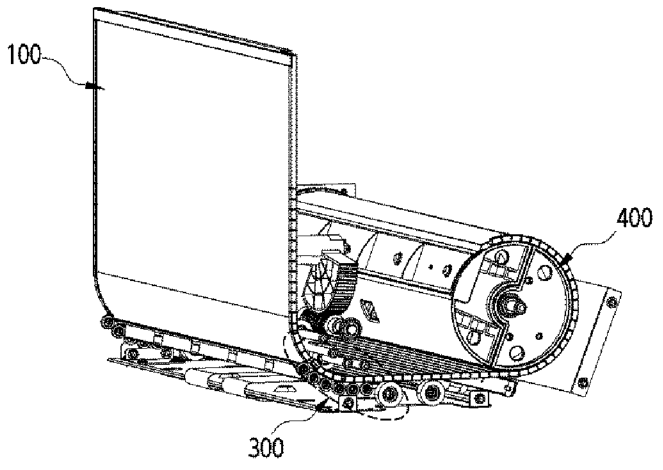
FIGS. 4A and 4B are front perspective views showing the inside of a flexible display device for a vehicle according to an embodiment of the present disclosure.
Figure 4B:
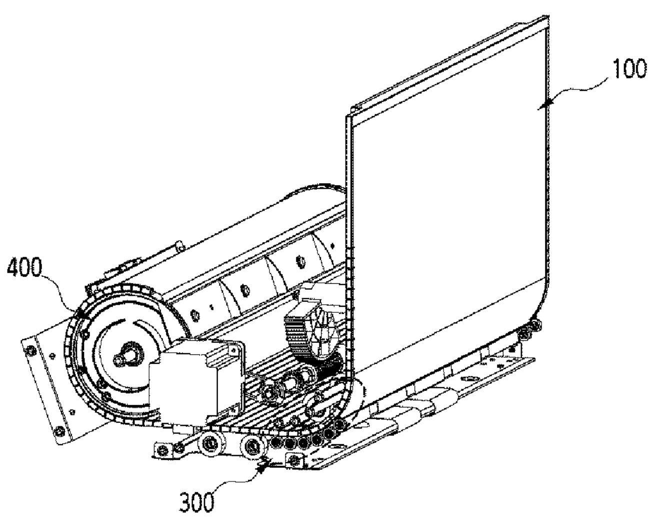
Figure 4C:
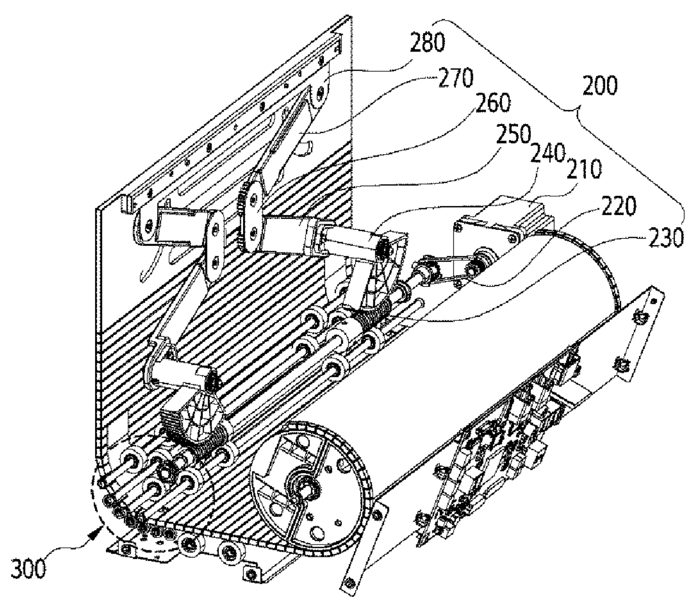
FIGS. 4C and 4D are rear perspective views showing the inside of a flexible display device for a vehicle according to an embodiment of the present disclosure.
Figure 4D:
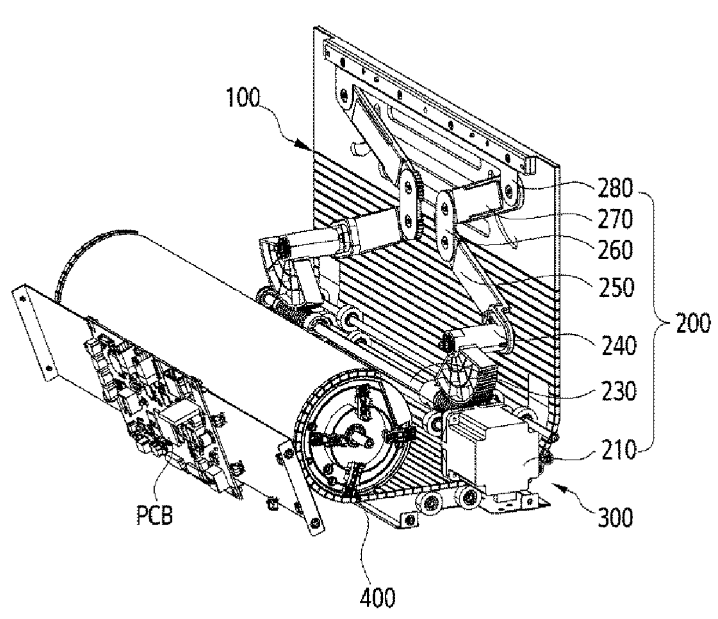

The worm wheel part 240 may be connected to the worm gear part 230 and include a worm wheel gear having a rotation shaft perpendicular to the rotation shaft of the motor 210 or the worm gear part 230. As shown in FIG. 4C, since a rotation shaft of the motor 210 is horizontal to the left and right of the display device 1000, a rotation shaft of the worm wheel part 240 may be perpendicular to an exposed surface of the display 110. The worm wheel part 240 may rotate on a virtual plane parallel to the plane of the display 110 by rotation of the motor 210.

The first driving arm 250 may have one end connected to the worm wheel part 240 and pivot according to rotation of the worm wheel part 240. The first driving arm 250 may be an arm member having a predetermined length and may pivot on a virtual plane parallel to an exposed surface of the display part 100. The first driving arm 250 may be located adjacent to a rear surface of the display part 100.

One end of the second driving arm 270 may be pivotably connected to the other end of the first driving arm 250, and the other end of the second driving arm 270 may be pivotably connected to an upper end of the display part 100. The first driving arm 250 and the second driving arm 270 may be connected in the form of meshing teeth as shown in the drawing. A connecting portion of the first driving arm 250 and the second driving arm 270 may be connected to a gear (e.g., a spur gear), and thus when the first driving arm 250 pivots, the second driving arm 270 may also pivot. Accordingly, the second driving arm 270 may pivot according to rotation of the worm wheel part 240.

The second driving arm 270 may be an arm member having a predetermined length and may pivot on a virtual plane parallel to an exposed surface of the display part 100. That is, the second driving arm 270 may pivot on the same plane as a pivoting plane of the first driving arm 250. However, the second driving arm 270 may pivot in a direction opposite to that of the first driving arm 250. For example, when the first driving arm 250 pivots clockwise, the second driving arm 270 may pivot counterclockwise. The second driving arm 270 may be positioned adjacent to the rear surface of the display part 100, and movement of the second driving arm 270 may be guided by a guide provided in the upper fixing plate 150.

As shown in FIG. 4C, the upper fixing plate 150 may have a groove for guiding the second driving arm 270. Although not shown, the upper fixing plate 150 may include a groove for guiding the first driving arm 250.

The display driver 200 may further include an arm joint 260 for fixing a connection state between the first driving arm 250 and the second driving arm 270. The arm joint 260 may ensure that cogwheels of the first drive arm 250 and cogwheels of the second drive arm 270 are well engaged but connection therebetween is not released.

A joint spacer 262 may be added to a connection portion between the first driving arm 250, the second driving arm 270, and the arm joint 260 to remove a gap formed by an assembly step. The joint spacer 262 may be positioned in an interval between the first driving arm 250 and the arm joint 260 and between the second driving arm 270 and the arm joint 260, and thus the aforementioned gap may be removed. The joint spacer 262 may minimize a front-back tilt of the display part 100 that may occur in a situation in which the display part 100 is extended to the maximum.

The worm wheel part 240, the first driver 250, and the second driver 270 may be provided symmetrically left and right with respect to the center of the display part 100. That is, the display driver 200 may include a pair of first driving parts 250 that are left and right symmetric, a pair of second driving parts 270 that are left and right symmetric, and a pair of the worm wheel parts 240 that are left and right symmetric.

At this time, rotation directions of the pair of first drivers 250 are opposite to each other, and rotation directions of the pair of second drivers 270 are opposite to each other.

The other ends of the pair of second drivers 270 may be rotatably connected to the upper end of the display part 100, and the upper arm joint 280 for connecting the second driver 270 to the upper end of the display part 100 may be provided. The upper arm joint 280 may have a predetermined length in a horizontal direction, and both ends thereof may be rotatably connected to the other ends of the pair of second drivers 270, respectively. The upper arm joint 280 may be connected to an upper end of the upper fixing plate 150 of the display part 100.

The first driver 250 and the second driver 270 may include a metal material and may be formed of aluminum (AL). Materials of the arm joint 260 and the upper arm joint 280 may include steel electrolytic cold commercial (SECC) or SUM specified in the Korean Industrial Standards (KS). A material of the joint spacer 262 may include PET. A material of the worm wheel gear may include Polyoxymethylene (POM), and a material of the worm gear may include brass.

Hereinafter, movement of the display driver 200 will be described.

Figure 8A:
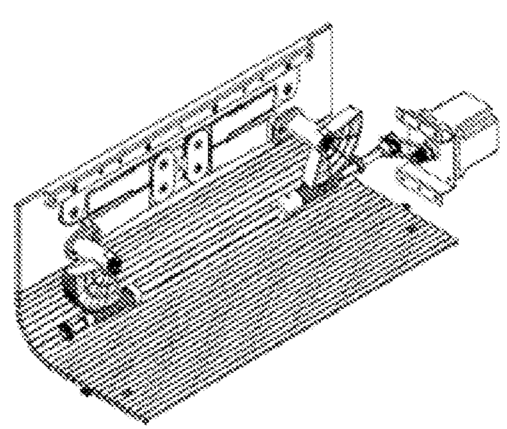
FIG. 8A is a diagram showing a display driver in a state in which the display part is not exposed.
Figure 8B:
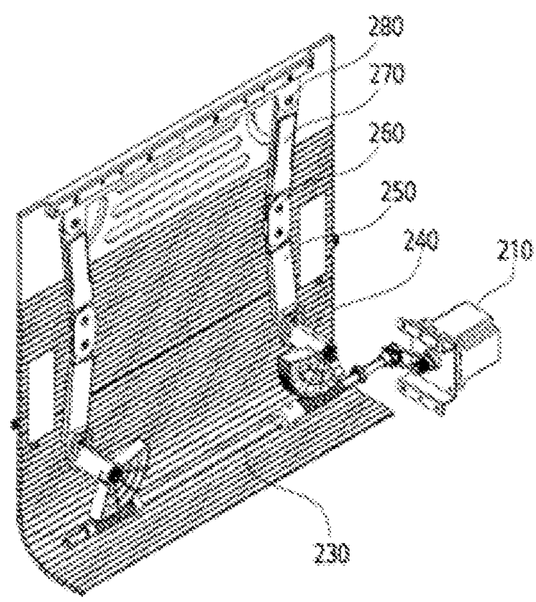
FIG. 8B shows the display driver in a state in which the display part is exposed to the maximum.

FIGS. 8A and 8B are diagrams for explaining an operation process of the display driver 200 of the display device 1000. FIG. 8A shows the display driver 200 in a state in which the display part 100 is not exposed, and FIG. 8B shows the display driver 200 in a state in which the display part 100 is exposed to the maximum.

Referring to a process of extending the display part 100 from FIG. 8A to FIG. 8B, rotation of the motor 210 may cause the worm gear part 230 to rotate. When the worm gear part 230 rotates, the pair of the worm wheel part 240 may rotate clockwise and counterclockwise, respectively. The pair of first driving parts 250 each rotate in the same direction as the pair of the worm wheel parts 240. Therefore, the other end (connection portion with the second driver) of the first driver 250 gradually rises upward, and the second driver 270 connected to the first driver 250 rotates in an opposite direction to a direction of rotation of the first driver 250. The other end (a connection portion of the upper arm joint 280) of the second driver 270 is rotatably connected to a point at an upper end of a rear surface of the display part 100. Accordingly, the second driver 270 may raise the display part 100.

A process of retracting the display part 100 from FIG. 8B to FIG. 8A may be performed by rotating the motor 210 in an opposite direction to the above description.

Figure 10:
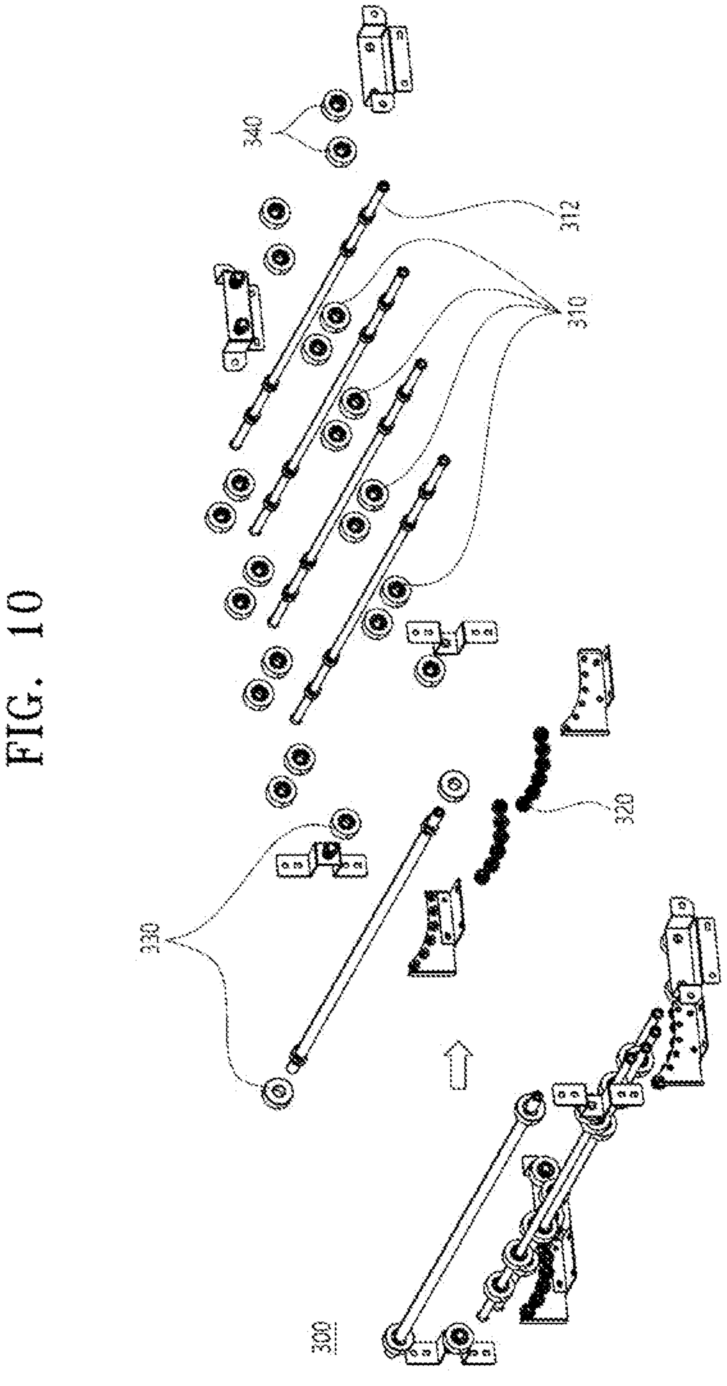
FIG. 10 is an exploded view of a guide part of a display device.
Figure 11:
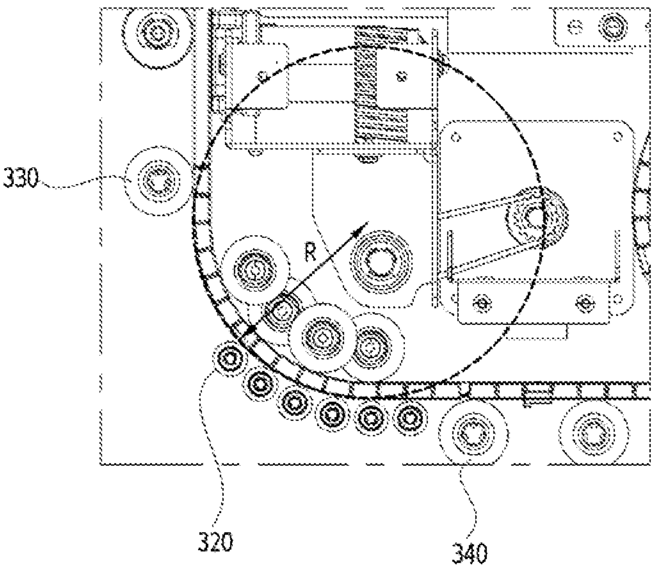
FIG. 11 shows arrangement of a guide part in a display device.

FIG. 10 is an exploded view of the guide part 300 of the display device 1000, and FIG. 11 shows arrangement of the guide part 300.

The guide part 300 is connected to the inside of a casing and is a component that guides movement of the display part 100. The guide part 300 may guide the display part 100 to have a path along which the display part 100 moves and which has a curvature radius in a range of 30 mm to 70 mm. In detail, the guide part 300 may guide the display part 100 to have a path along which the display part 100 moves and which has a curvature radius R in a range of 45 mm to 55 mm. The display part 100 may be bent according to the curvature radius guided by the guide part 300 as being retracted or extended into or out of the casing.

The guide part 300 may include a curvature guide for guiding a movement path in which a curvature radius is formed, and the curvature guide may include a front curvature guide 310 in contact with a front surface of the display part 100, and a rear curvature guide 320 in contact with a rear surface of the display part 100. The front curvature guide 310 and the rear curvature guide 320 may include a plurality of rollers. The size and shape of the roller may be appropriately selected by one of ordinary skill in the art.

The curvature guide of the guide part 300 may include a plurality of rollers connected to a guide fixing bar 312 disposed in left and right directions in an inner space of the casing, or may include a plurality of rollers fixed to various frames or brackets of the part fixing part 500 (refer to FIG. 15) inside the casing.

In addition, the guide part 300 may further include a first straight guide 330 and a second straight guide 340 that guide the display part 100 in a vertical or horizontal direction. Referring to FIG. 11, the first straight guide 330 guides the display part 100 in a vertical direction, and the second straight guide 340 guides the display part 100 in a horizontal direction.

A material of the plurality of rollers may include rubber or polyoxymethylene (POM). In addition, a material of the frame or bracket for fixing the rollers may include steel electrolytic cold commercial (SECC) or SUM specified in the Korean Industrial Standards (KS).

The guide part 300 may also function as a guide in a manner different from that shown in the drawings. One of ordinary skill in the art may apply a known guide method, and the guide part 300 of the present specification may include a known guide method.

Figure 12A:
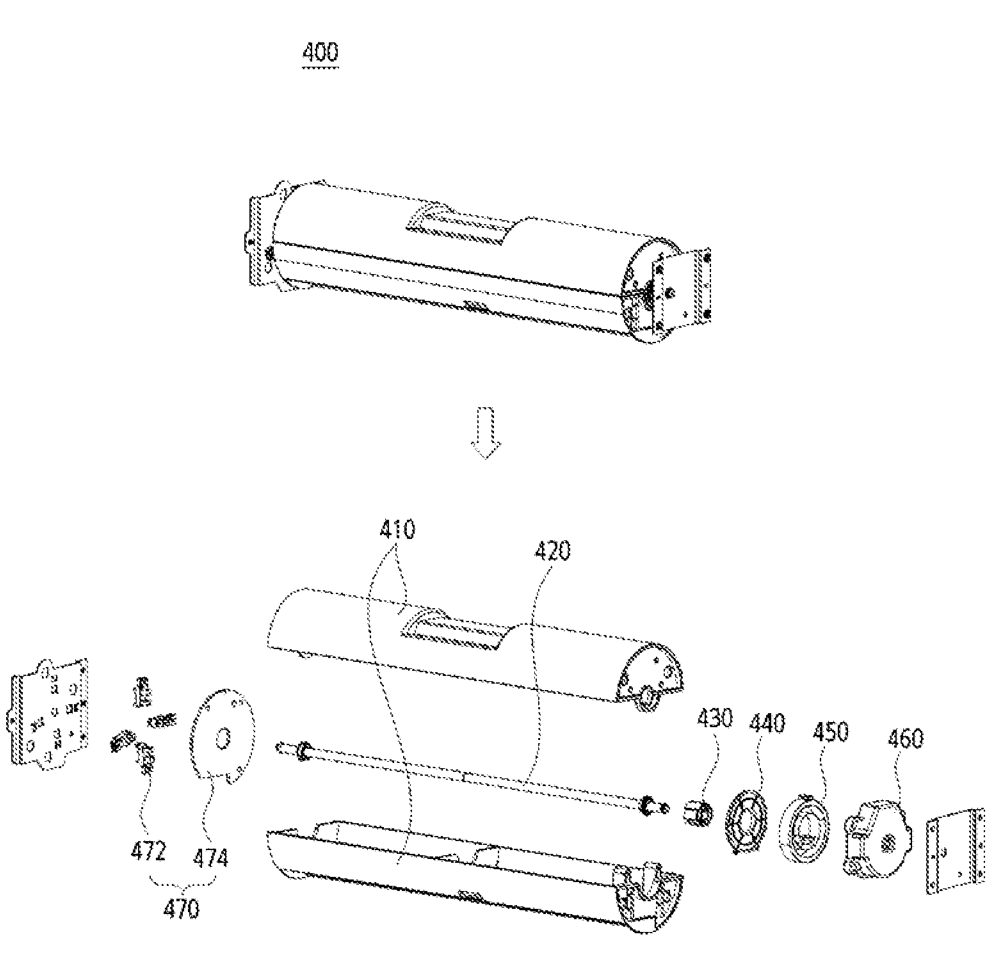
FIG. 12A is an exploded view of a display winder of a display device.

FIG. 12A is an exploded view of the display winder 400 of the display device 1000.

The display winder 400 is a component for winding the display part 100 according to retraction and extension of the display part 100. The display winder 400 may include a rotary drum 410 and a sensor recognizer 470 for detecting a rotation state of the rotary drum 410.

The rotary drum 410 rotates around a drum shaft 420 installed in left and right horizontal directions inside a casing as a center shaft. In addition, the rotary drum 410 may have a cylindrical shape, and the display part 100 may be wound or unwound again on an outer circumferential surface of the cylindrical shape. The rotary drum 410 may include a rotary spring 450. The rotary spring 450 applies an elastic force for the rotary drum 410 to rotate in a direction in which the display part 100 is wound. Therefore, the display part 100 may be pulled downward by the rotary spring 450, and a display screen may be maintained flatter than before by the force.

The rotary drum 410 may further include a spring case 460, a cap 440, and a holder 430. The spring case 460 may be a case having an inner space for accommodating the rotary spring 450, and the cap 440 may be a component for closing the opening of the spring case 460 in which the rotary spring 450 is accommodated. The holder 430 may be a component that fixes the positions of the components (spring case and cap) related to the rotary spring 450.

The sensor recognizer 470 detects a rotation state of the rotary drum 410. the sensor recognizer 470 may include a plurality of sensors 472 and a detection part 474 sensed by the plurality of sensors. The detection part 474 may rotate with the rotary drum 410 and may be detected by at least one sensor among the plurality of sensors 472.

Sensing states of the plurality of sensors 472 may be different according to a rotation state of the rotary drum 410, and an operation of the motor 210 may be controlled based on the sensing state of the plurality of sensors 472. In other words, based on the rotation state of the rotary drum 410, one of the plurality of sensors 472 may recognize a state different from the other sensors, and the operation of the motor 210 may be controlled accordingly.

A material of the rotary drum 410 may include acrylonitrile butadiene styrene (ABS), a material of the spring case 460, the cap 440, and the holder 430 may include polyoxymethylene (POM), and a material of the rotary spring 450 may include SUS. A material of a bracket related to the display winder 400 may include steel electrolytic cold commercial (SECC).

Figure 12B:
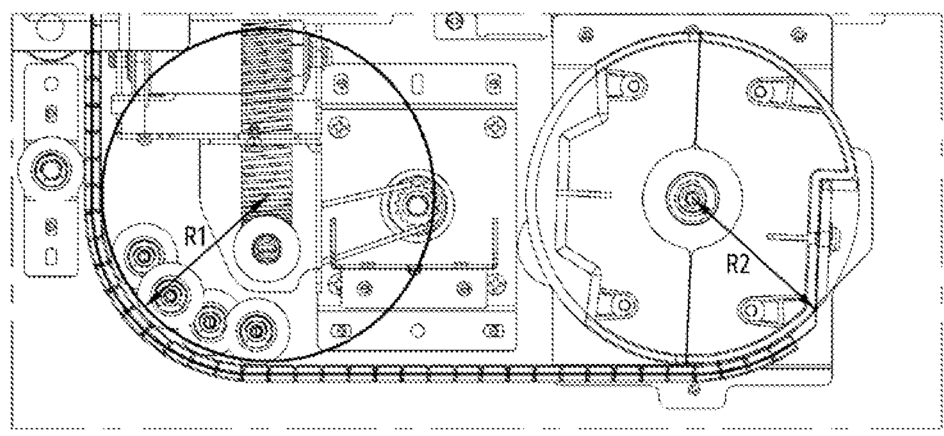
FIG. 12B shows the inside of a display device from the side.

FIG. 12B shows the inside of a display device from the side.

Referring to FIG. 12B, R2 denotes a radius of a cross section of the rotary drum 410 having a circular cross section, and R1 denotes a radius of curvature at which the display part 100 is bent. The radius R2 of the cross section of the rotary drum 410 may be at least equal to or larger than R1.

Figure 12C:
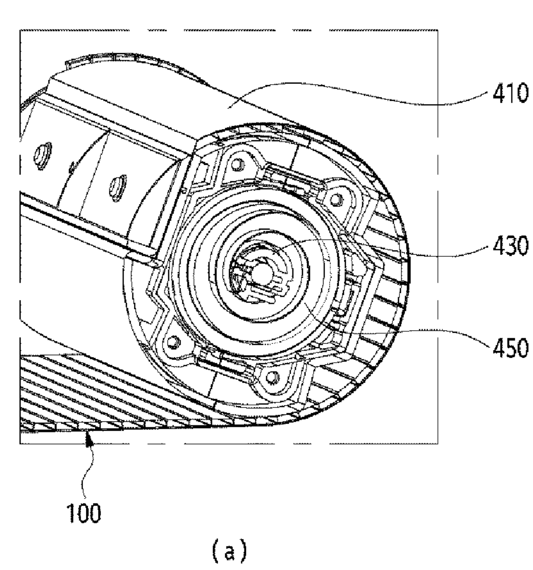
FIG. 12C shows components related to a rotary spring of a display device.
Figure 12C:
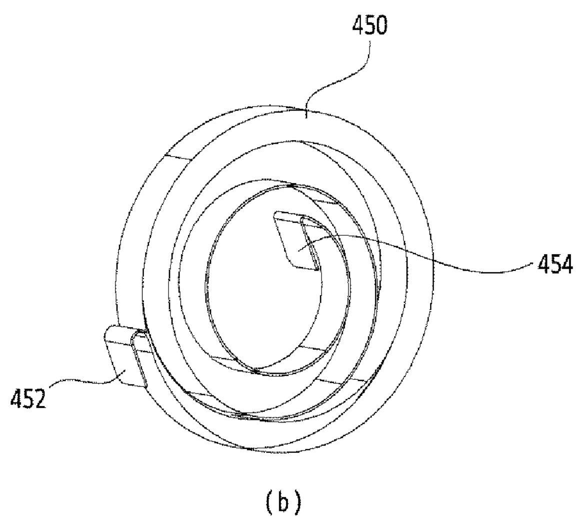

FIG. 12C shows components related to the rotary spring 450 of the display device.

(a) of FIG. 12C shows the case in which the rotary drum 410, the spring case 460, the rotary spring 450, and the holder 430 are coupled, and (b) of FIG. 12C is an enlarged view of the rotary spring 450.

Referring to (a) of FIG. 12C, the spring case 460 is fixed to a left or right end of the rotary drum 410, and the rotary spring 450 is accommodated in an accommodation space inside the spring case 460. The holder 430 is located in a central portion of the accommodation space of the spring case 460 to maintain a constant state irrespective of rotation of the rotary drum 410.

Referring to (b) of FIG. 12C, the rotary spring 450 is formed of an elastic object having a spiral shape, and the rotary spring 450 may include a first fixing hook 452 on the outside of the spiral shape and a second fixing hook 454 on a central portion of the spiral shape.

Referring to (a) of FIG. 12C, the first fixing hook 452 of the rotary spring 450 is connected to a groove formed inside the spring case 460, and the second fixing hook 454 of the rotary spring 450 is connected to a groove formed in the holder 430. When the rotary drum 410 rotates, the spring case 460 also rotates, and as the spring case 460 rotates, the position of the first fixing hook 452 changes. In contrast, since the second fixing hook 454 is connected to the holder 430 in a constant state, the position of the fixing hook 452 does not change. In the end, since relative positions of the first fixing hook 452 and the second fixing hook 454 of the rotary spring 450 change, an elastic force to return the relative positions of the first fixing hook 452 and the second fixing hook 454 to an original state is generated. Since the elastic force eventually acts on the rotary drum 410, the rotary drum 410 receives a force to return to an initial state by the rotary spring 450.

The elastic force of the rotary spring 450 acts in a direction in which the rotary drum 410 winds the display part 100.

Figure 12D:
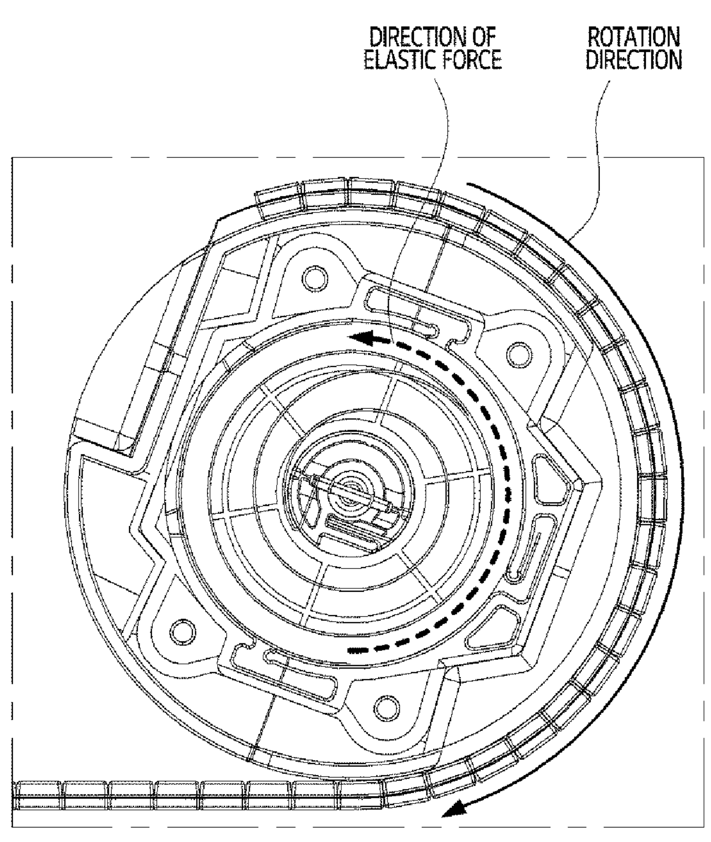
FIG. 12D shows a direction of an elastic force acting on a rotary drum of a display device.

FIG. 12D shows a direction of the elastic force acting on the rotary drum 410 of the display device. A rotation direction of the rotary drum 410 is indicated by a solid arrow, and a direction in which an elastic force of the rotary spring 450 acts is indicated by a dotted arrow. As shown in the drawing, when the rotary drum 410 rotates in a direction in which the display part 100 is unwound, the elastic force of the rotary spring 450 acts in a direction in which the display part 100 is pulled.

Figure 13A:
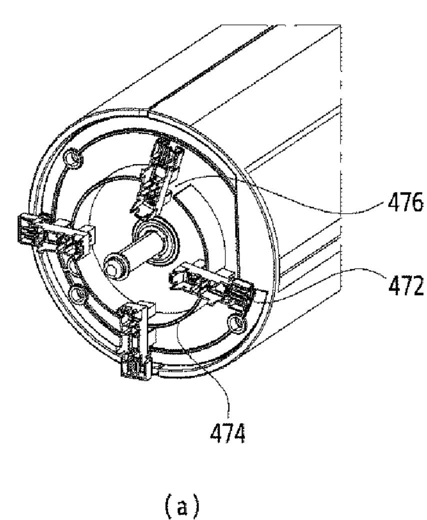
FIG. 13A is a diagram for explaining control of exposure of a display according to rotation of a display winder.
Figure 13A:
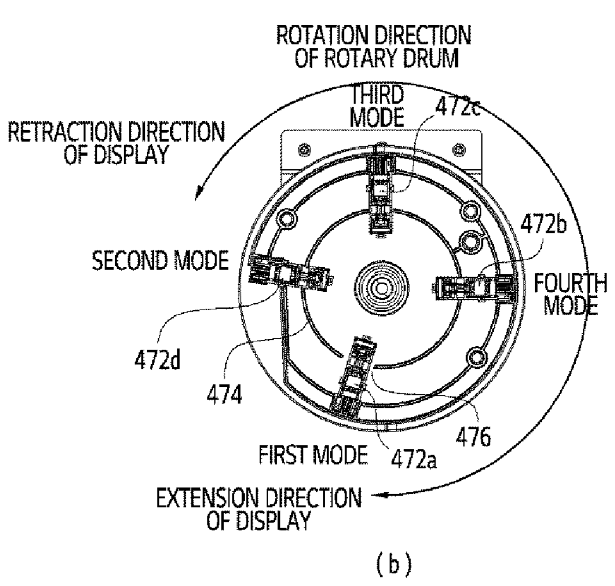

FIG. 13A is a diagram for explaining control of exposure of a display according to rotation of the display winder 400.

Figure 13B:
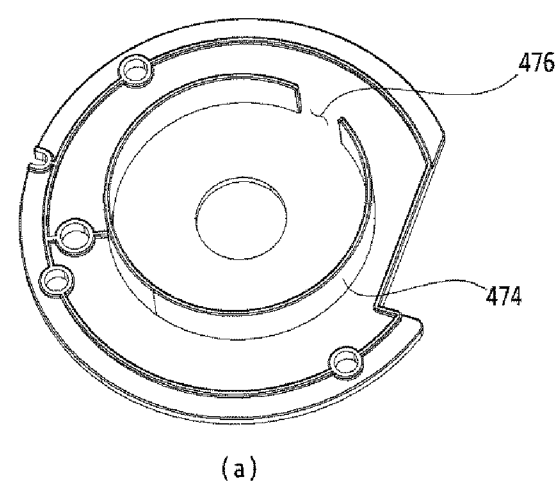
FIG. 13B illustrates a principle by which sensors recognize a detection part.
Figure 13B:
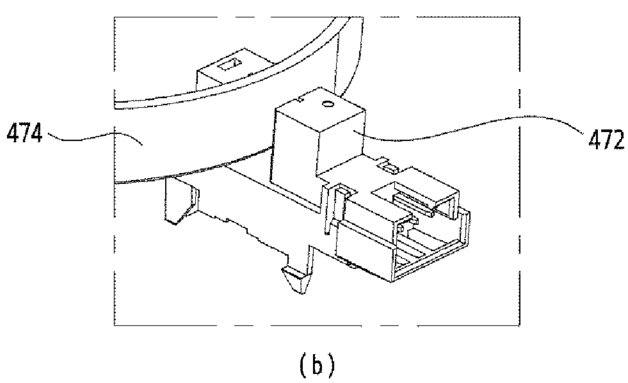
Figure 13B:
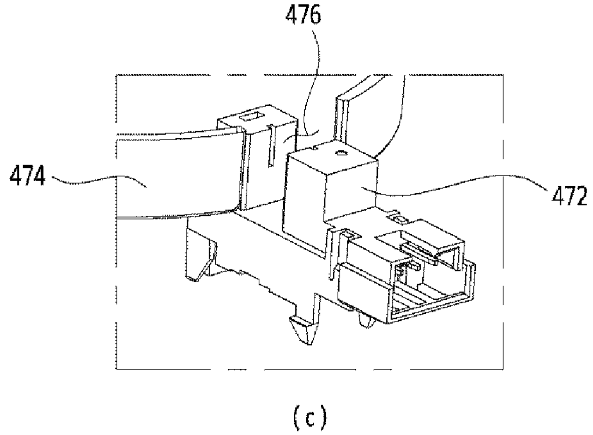

FIG. 13B illustrates a principle by which the sensors 472 recognize the detection part 474.

Referring to (a) of FIG. 13A, the plurality of sensors 472 is fixed at a position in which rotation of the rotary drum 410 is to be sensed. According to the present embodiment, the plurality of sensors 472 may be connected to an inner surface of a casing positioned adjacent to the rotary drum 410 or other places such as a bracket having a fixed position. That is, the sensors 472 may not rotate with the rotary drum 410, but may detect a rotation state of the rotary drum 410 at a certain position.

The detection part 474 is connected to the rotary drum 410 and rotates therewith when the rotary drum 410 rotates.

The detection part 474 may have an appropriate shape for any one of the plurality of sensors 472 and the remaining sensors to detect different states. Accordingly, the detection part 474 may have various shapes depending on installation positions of the plurality of sensors 472.

According to an embodiment, when the plurality of sensors 472 includes a first sensor, a second sensor, a third sensor, and a fourth sensor, the shape of the detection part 474 may be provided such that when the first sensor recognizes the detection part 474 (on), the second sensor to the fourth sensor do not recognize the detection part 474 (off). In contrast, the shape of the detection part 474 may be provided such that if the first sensor does not recognize the detection part 474 (off), the remaining sensors (the second to fourth sensors) recognize the detection part 474 (on).

Referring to (a) of FIG. 13A and FIG. 13B, the detection part 474 has a shape protruding from an end of the rotary drum 410 to pass through an area in which each of the sensors 472 recognizes (on or off) according to rotation of the rotary drum 410. Here, the area recognized by the sensors 472 may indicate an area in which the sensors 472 are capable of recognizing the detection part 474. The sensors 472 may include a photosensor, and the detection part 474 may include a hole 476.

The hole 476 may be a hole formed in the detection part 472, and the sensors 472 may differently sense the hole 476 and the remaining part of the detection part 472. The remaining part of the detection part 472 blocks a space between a light emitting part and a light receiving part of the sensors 472 (refer to (b) of FIG. 13B), whereas the hole 476 of the detection part 472 opens the space between the light emitting part and the light receiving part of the sensors 472 (refer to (c) of FIG. 13B), and thus the sensors 472 may detect the hole 476 differently from the remaining part. A display device according to embodiments may have a configuration other than a hole such as the hole 476 depending on a type of sensor.

When the rotary drum 410 rotates, the detection part 474 rotates, and the position of the hole 476 formed in the detection part 474 may be changed. When the rotary drum 410 rotates by a predetermined angle and the position of the hole 476 is in a recognition area of any one of the sensors 472, the corresponding sensor may recognize the hole 476. Thus, based on which sensor detects the hole 476, a degree by which the rotary drum 410 rotates may be recognized. When a rotation state of the rotary drum 410 is classified for each mode, an exposure range of the display part 100 may be controlled.

Referring to (b) of FIG. 13A, a first mode is a state in which the display part 100 is retracted and the rotary drum 410 winds the display part 100 to the maximum.

It may be seen that when the hole 476 of the detection part 474 is located in a recognition region of a first sensor 472*a*, an exposure mode of the display part 100 is the first mode. It may be seen that when the rotary drum 410 rotates and the hole 476 is located in a recognition region of a second sensor 472*b*, the exposure mode of the display part 100 is a second mode. Similarly, a third mode and a fourth mode may also be distinguished depending on which sensor with a recognition region in which the hole 476 is located.

For example, when the second mode is executed according to user selection, the display driver 200 may drive the motor 210 to extend the display part 100 and the rotary drum 410 rotates accordingly. At a moment at which the display part 100 is exposed in the second mode, the plurality of sensors 472 may recognize that the second mode is entered. In this case, sensing states (on or off) of the second sensor 472*b* corresponding to the second mode and the remaining sensors among the plurality of sensors 472 may become different. For example, the second sensor 472*b* may be in an on state, and the remaining sensors may be in an off state. The display device 1000 may be recognized to become in the second mode state and an operation of the motor 210 may be stopped.

In the case of the third mode, the display part 100 is exposed more than the second mode. When the third mode is executed by user selection, the display driver 200 may drive the motor 210 to further extend the display part 100, and when the sensor recognizer 470 recognizes that the third mode is entered, driving of the motor 210 may be stopped.

In the same way, the display device 1000 may differently control a degree of exposure of the display part 100 according to various modes. An exposure mode of the display part 100 may be divided into four modes including the first mode in which the display part 100 is completely retracted into the casing and the fourth mode in which the display part 100 is completely extended out of the casing. Each mode may be classified according to a type and function of information displayed on the display 110. For example, the third mode may be used on a navigation screen, and the fourth mode may be used when a video or game is played.

An exposure mode of the display device 1000 may be classified into more types of modes according to an exposure range, and the number of the sensors 472 may be one or more.

Figure 14A:
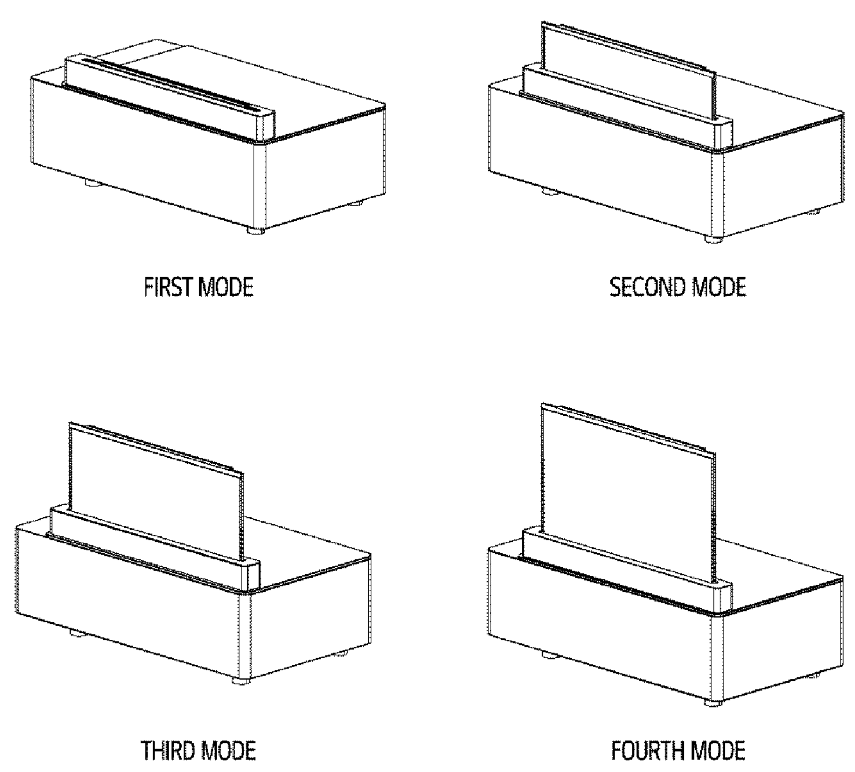
FIGS. 14A to 14C show movement of a display driver according to an exposure mode of a display.

FIG. 14A shows a degree of by which the display part 100 is exposed according to a first mode to a fourth mode.

Figure 14B:
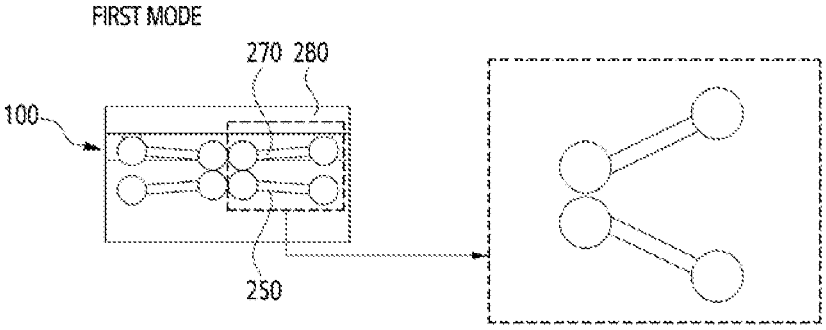
Figure 14B:
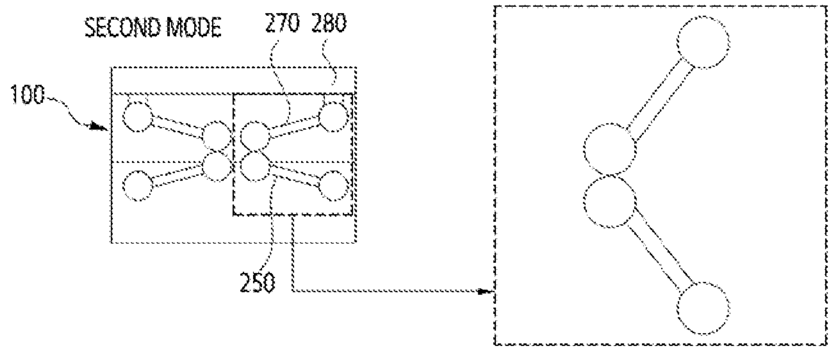
Figure 14C:
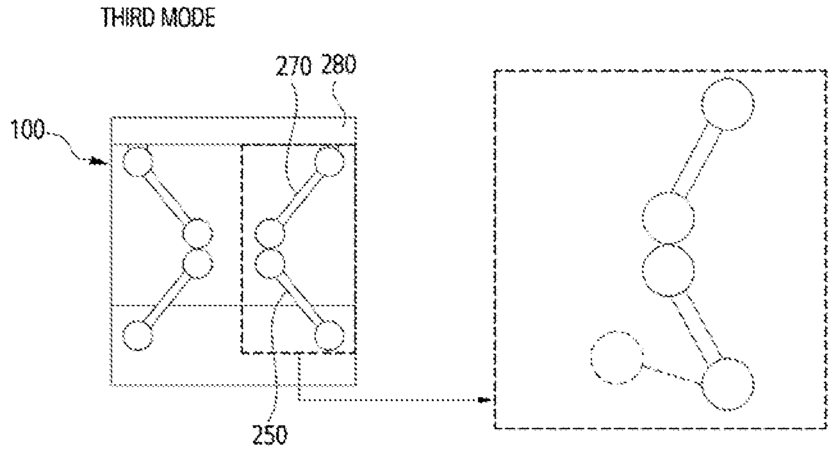
Figure 14C:
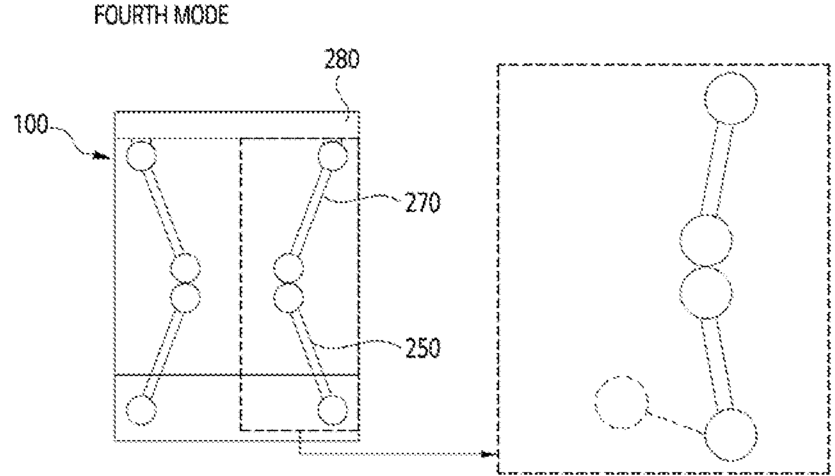

FIGS. 14B and 14C show states of the first driving arm 250 and the second driving arm 270 for each exposure mode as numerical values. A portion marked with a dotted line in the second mode to the fourth mode represents an initial state (first mode).

Figure 15:
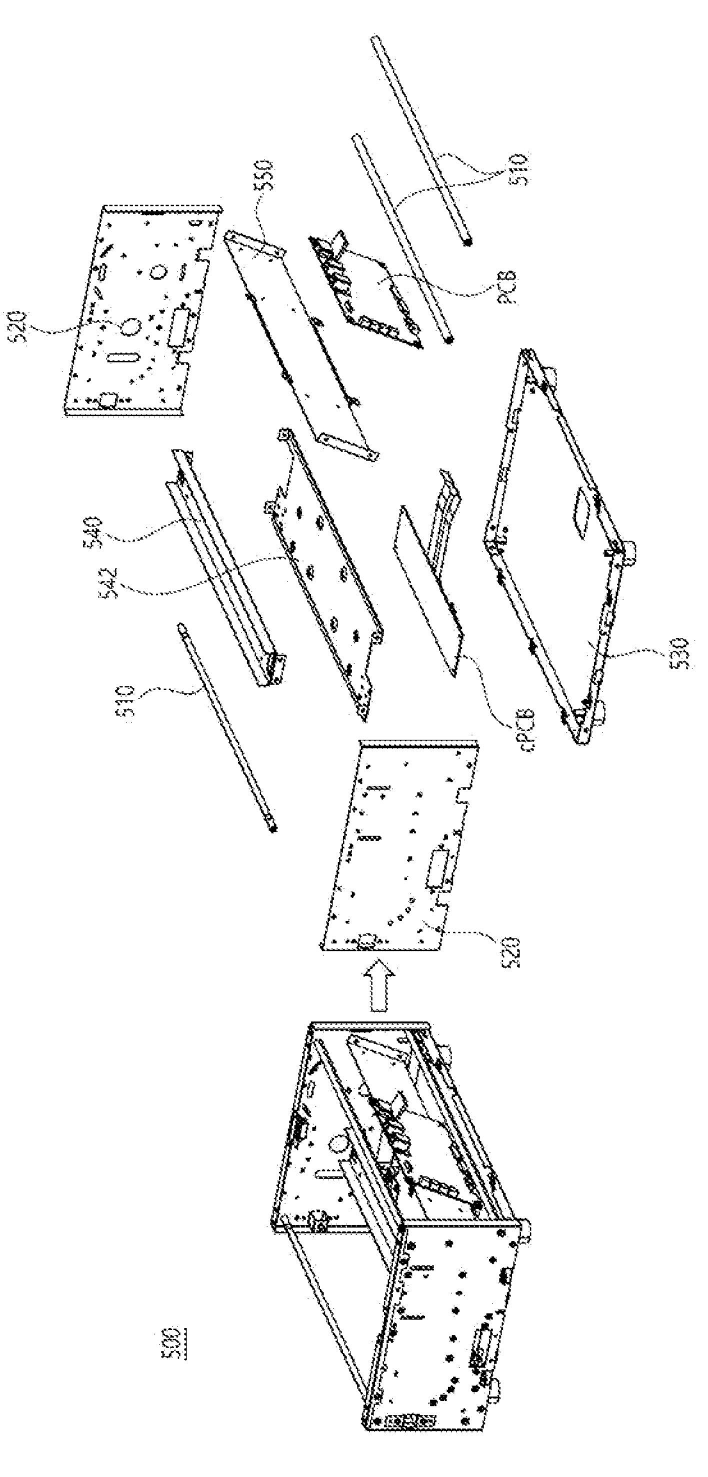
FIG. 15 is an exploded view of a component fixing part of a display device.

FIG. 15 is an exploded view of a component fixing part 500 of the display device 1000.

The component fixing part 500 is located inside a casing and includes a frame, a rod, etc. for fixing the aforementioned components to a specific location or maintaining a shape of a case. The component fixing part 500 may include an interval adjustment rod 510, the side fixing frame 520, the bottom fixing frame 530, a first driver support frame 540, a second driver support frame 542, and a PCB support frame 550. The component fixing part 500 may fix a cPCB and a main PCB to the frame.

The interval adjustment rod 510 is a rod arranged horizontally to the left and right inside the casing. The interval adjustment rod 510 may be plural, and may be provided at an appropriate position to fix shapes of the frames.

The side fixing frame 520 is a flat frame positioned adjacent to a left or right surface inside the casing, and the bottom fixing frame 530 is a flat frame positioned adjacent to a lower surface inside the casing.

The first driver support frame 540 and the second driver support frame 542 are frame components for supporting or fixing components corresponding to the display driver 200.

The PCB support frame 550 is a frame component for fixing a PCB.

A material of the component fixing part 500 may include steel electrolytic cold commercial (SECC) or SUS.

FIGS. 16 to 20 are diagrams for explaining a display device 2000 according to another embodiment of the present disclosure.

Figure 16:
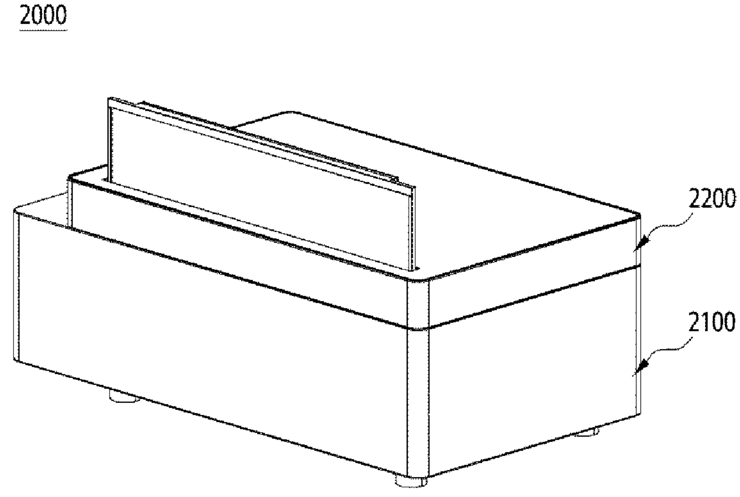
FIG. 16 is a front perspective view of a flexible display device for a vehicle according to another embodiment of the present disclosure.
Figure 17:
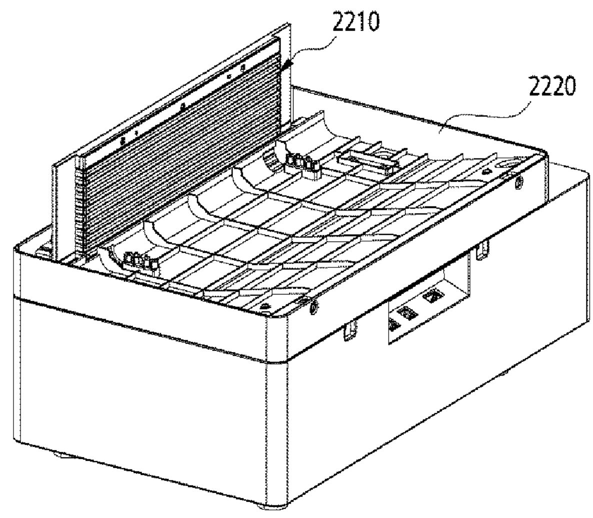
FIG. 17 is a rear perspective view of a flexible display device for a vehicle according to another embodiment of the present disclosure.
Figure 18:
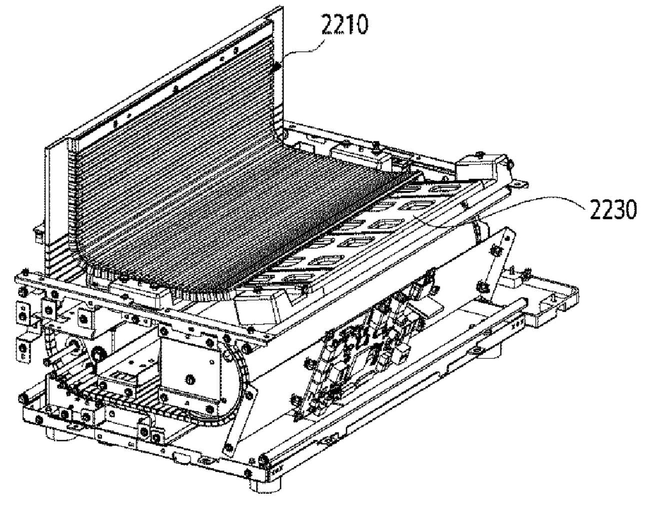
FIG. 18 is a rear perspective view showing the inside of a flexible display device for a vehicle according to another embodiment of the present disclosure.

FIG. 16 is a front perspective view of the display device 2000, and FIG. 17 is a rear perspective view of the display device 2000 in a state in which an upper cover is removed. FIG. 18 is a rear perspective view of the inside of a casing of the display device 2000.

The display device 2000 according to another embodiment of the present disclosure is different from the display device 1000 in that the display device 2000 further includes a rear cover part 2200. In describing the display device 2000, the same components as those of the aforementioned display device 1000 will be described using the same reference numerals.

The rear cover part 2200 may cover a rear surface of the display part 100 and the display driver 200 (a first driving arm or a second driving arm) exposed to the outside to protect the components and improve the appearance of the device.

Figure 19:
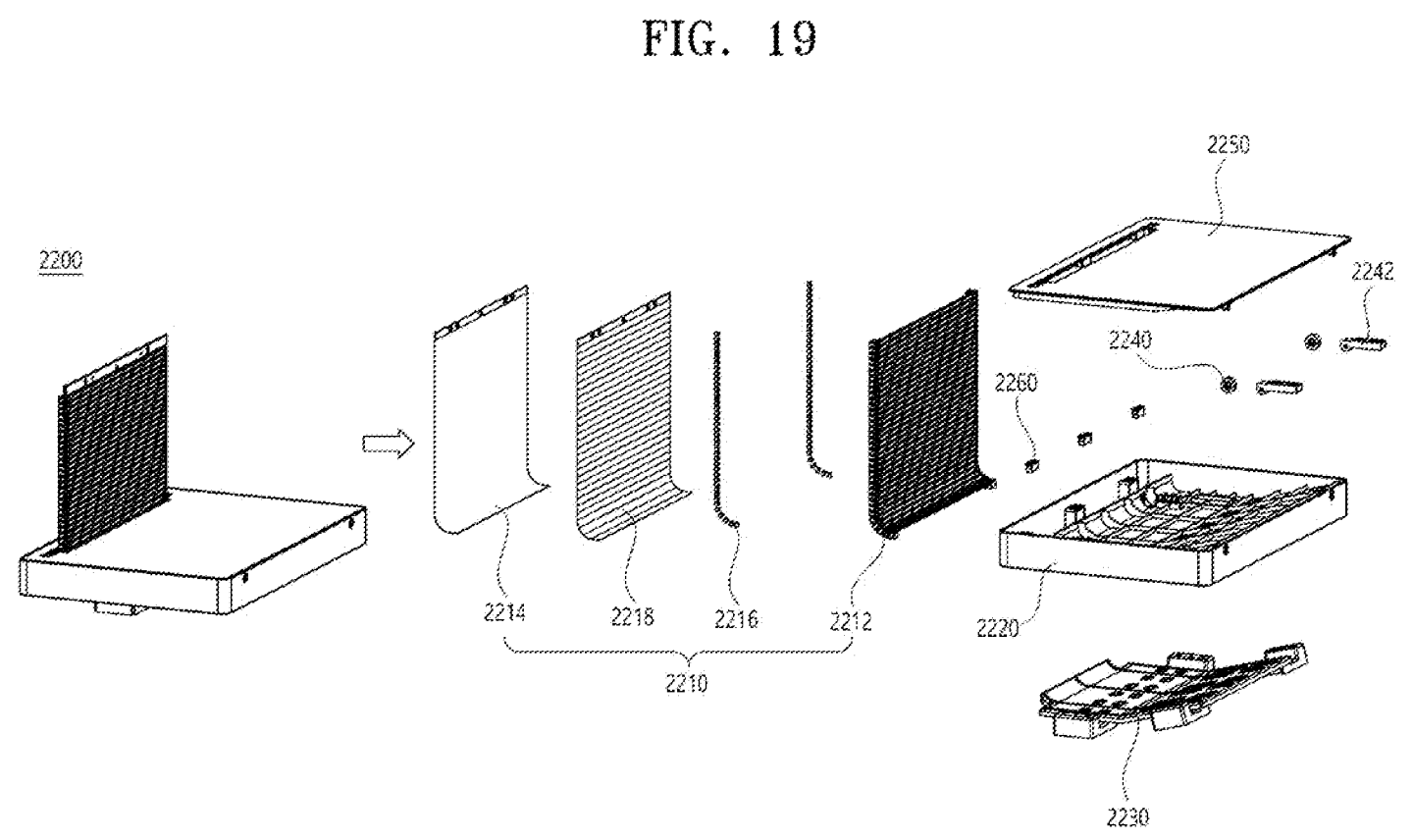

FIG. 19 is an exploded view of the rear cover part 2200 of the display device 2000.

The rear cover part 2200 may include the rear protection cover 2210, an upper cover guide part 2220, and a lower cover guide part 2230.

The rear protection cover 2210 is attachable to or detachable from a rear surface of the display part 100 and covers an exposed rear surface of the display part 100.

The rear protection cover 2210 may include a rear detachable cover 2212, a magnetism part 2216, a double-sided adhesive 2218, and a cover reinforcement sheet 2214.

The rear detachable cover 2212 is a cover that protects a rear surface of the display part 100 or an exposed portion of the display driver 200. The rear detachable cover 2212 may include a plurality of covers that are long in a horizontal direction and short in a vertical direction. The plurality of covers may be attached to one surface of the cover reinforcement sheet 2214 through the double-sided adhesive 2218. The double-sided adhesive 2218 may include a double-sided tape such as a FOAM tape. Widths of the plurality of covers included in the rear detachable cover 2212 may be less than or equal to the width of the display part 100. The heights of the plurality of covers may be appropriately designed by one of ordinary skill in the art to a height for flexibly responding to bending.

The rear detachable cover 2212 may further include the magnetism part 2216 at both ends in a horizontal direction. The magnetism part 2216 includes a magnet to attach to and detach from the display part 100. The display cover 130 of the display part 100 may be provided with the magnetism part 160 at both left and right ends, and the magnetism part 160 of the display cover 130 and the magnetism part 2216 of the rear detachable cover 2212 may be attached to or detached from each other by magnets.

The display cover 130 of the display part 100 and the rear protection cover 2210 may have a plurality of magnets arranged in a vertical direction (or a retraction or extension direction of the display part) at positions corresponding to each other. The rear protection cover 2210 is separated from the display part 100 when the display part 100 is retracted into the casing, and magnetically attached to the exposed portion of the display part 100 when the display part 100 is extended out of the casing.

Figure 20:
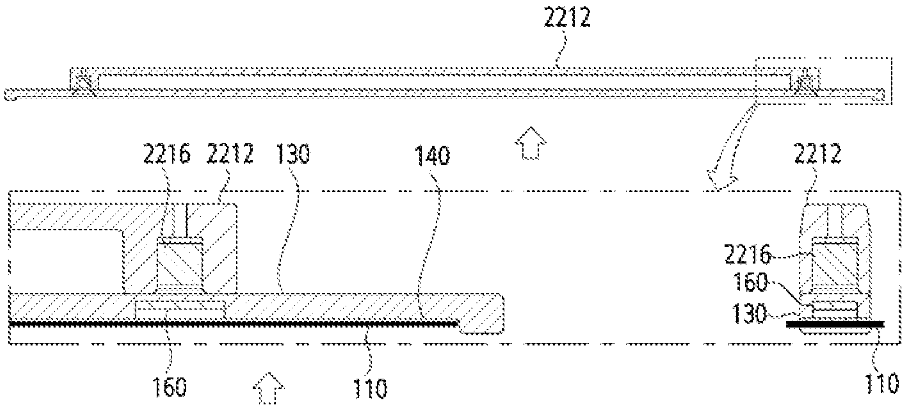
FIG. 20 shows a cross section of a connection portion of a rear protection cover and a display part.

FIG. 20 shows a cross section of a connection portion of the rear protection cover 2210 and the display part 100 in detail. As shown in FIG. 20, the magnetism part 2216 is provided at both left and right ends of the rear detachable cover 2212, and a position of the magnetism part 2216 corresponds to the position of the magnetism part 160 provided in the display cover 130.

The upper cover guide part 2220 and the lower cover guide part 2230 may guide the rear protection cover 2210 separated from the display part 100. The upper cover guide part 2220 comes into contact with an outer surface of the rear protection cover 2210 to guide the rear protection cover 2210, and the lower cover guide part 2230 comes into contact with an inner surface of the rear protection cover 2210 to guide the rear protection cover 2210. That is, movement of the separated rear protection cover 2210 is guided along a space between the upper cover guide part 2220 and the lower cover guide part 2230. The display device 2000 may have an inner space for built therein the rear protection cover 2210 at the top, and the rear protection cover 2210 may be extended out of a casing or may be retracted into the casing. and the rear protection cover 2210 may be extended out of the casing or retracted into the casing.

The upper cover guide part 2220 and the lower cover guide part 2230 may have a flat plate shape including a curved surface. The rear protection cover 2210 may be guided along a curved surface between a lower surface of the upper cover guide part 2220 and an upper surface of the lower cover guide part 2230.

In addition, the rear cover part 2200 may further include a cover guide roller 2240 fixed to the inside of the casing to guide the rear protection cover 2210 and a bracket 2242 supporting the cover guide roller 2240.

The casing of the rear cover part 2200 may further include an upper cover 2250 and a cover fixture 2260 for fixing the upper cover 2250.

A material of the rear detachable cover 2212 may include polycarbonate (PC) or aluminum. A material of the cover reinforcement sheet 2214 may include polyethylene terephthalate (PET). Materials of the upper cover guide part 2220, the lower cover guide part 2230, and the upper cover 2250 may include acrylonitrile butadiene styrene (ABS). A material of the cover guide roller 2240 may include rubber, and a material of the bracket 2242 may include steel electrolytic cold commercial (SECC).

The rear cover part 2200 may have a structure to be disassembled or assembled in the display device 2000, and whether or not to apply the rear cover part 2200 may be selected according to user preference or a vehicle environment.

According to the embodiments of the present disclosure, as a flexible display is retracted or extended into or out of the casing by winding the display, a volume of the device required for storing the display may be reduced. In addition, an exposure range of the display may be controlled by a sensor recognition method appropriately applied to the method of winding the display, and the effectiveness of the display device may be improved. By controlling the exposure range of the display, only an exposed area may be displayed, and power consumption due to use of the display may be reduced.

The display device according to the embodiments may be applied to various positions such as a center, a passenger display, a center console display, a rear seat entertainment display, a rear center display, or a rear control display of a vehicle.

It may be understood that the description of the various embodiments of the present disclosure is not limited to the corresponding embodiment, and the technical idea of each embodiment applied in the various embodiments may be applied to other embodiments as well.

The detailed description of the exemplary embodiments of the present disclosure is given to enable one of ordinary skill in the art to realize and implement the present disclosure. While the present disclosure has been described referring to the exemplary embodiments of the present disclosure, one of ordinary skill in the art will appreciate that many modifications and changes may be made to the present disclosure without departing from the spirit and essential characteristics of the present disclosure. For example, the structures of the above-described embodiments of the present disclosure may be used in combination.

Therefore, the present disclosure intends not to limit the embodiments disclosed herein but to give the broadest range matching the principles and new features disclosed herein.

According to any one of the embodiments of the present disclosure, the usability of an inner space of a vehicle may be increased by reducing the size of an accommodation space for a display.

According to any one of the embodiments of the present disclosure, the usability of the display may be increased by adjusting a degree of exposure of the display, and power may be saved by using only the exposed portion of a display area.

In addition, according to any one of the embodiments of the present disclosure, a flexible display may be retracted or extended into or out of an accommodation space while being safely protected.

The effects obtainable in the present disclosure are not limited to the effects mentioned above, and other effects not mentioned are clearly understood by one of ordinary skill in the art from the description above.

What is claimed is:

1. A flexible display device for a vehicle, comprising:
- a casing having an opening;
- a display part configured to display information;
- a display driver configured to move the display part into and out of the casing through the opening of the casing; and
- a display winder configured to wind and unwind the display part as the display driver moves the display part into and out of the casing, respectively,
- wherein the display part includes a rotary drum having an outer circumferential surface on which the display part is wound,
- wherein, in the display part, an exposure range of the display part is controlled based on a rotation state of the rotary drum, and
- wherein:
  - the rotary drum includes a rotary spring; and
  - the rotary spring applies a force in a direction in which the display part is wound onto the rotary drum.

2. The flexible display device of claim 1, wherein the display part includes a sensor recognizer configured to detect the rotation state of the rotary drum.

3. The flexible display device of claim 2, wherein:
the sensor recognizer includes:
a plurality of sensors located inside the casing; and
a detection part connected to the rotary drum and configured to be detected by the plurality of sensors;
wherein the detection part has a shape that is configured to be detected by one sensor of the plurality of sensors at a time depending on the rotation state of the rotary drum.

4. The flexible display device of claim 3, wherein:
each of the sensors includes a photo sensor;
the detection part includes a hole; and
the hole is located in a recognition region of the one sensor of the plurality of sensors at a time depending on the rotation state of the rotary drum.

5. The flexible display device of claim 2, wherein the display part includes:
a flexible display; and
a display cover adhered to a rear surface of the flexible display,
wherein the flexible display is a plastic organic light-emitting diode (POLED).

6. The flexible display device of claim 5, wherein:
the display part further includes a flexible connecting sheet having a first side connected to the flexible display and a second side connected to the display winder; and
the flexible connecting sheet is wound onto the rotary drum by the display winder.

7. The flexible display device of claim 5, wherein:
the display driver includes:
a motor connected to an inside of the casing;
a worm gear part connected to the motor and having a rotation shaft arranged parallel to the motor; and
a worm wheel part connected to the worm gear part and having a rotation shaft arranged perpendicular to the motor;
wherein rotation of the motor causes the display driver to move the display part.

8. The flexible display device of claim 7, wherein the display driver includes a first driving arm having a first end connected to the worm wheel part and a second end connected to the display part, the first driving arm being configured to be pivoted by the worm wheel part.

9. The flexible display device of claim 8, wherein the display driver further includes a second driving arm having a first end connected to the second end of the first driving arm and a second end connected to the display part, the second driving arm being configured to be pivot in a same plane as a pivoting plane of the first driving arm and in an opposite direction to a pivoting direction of the first driving arm.

10. The flexible display device of claim 9, wherein:
the display part further includes an upper fixing plate in surface contact with a partial region of a rear surface of an upper end of the display;
the upper fixing plate includes a guide configured to guide one of the first driving arm and the second driving arm; and
a width of the upper fixing plate is at least equal to or greater than a width of the display.

11. The flexible display device of claim 7, wherein, in the display driver, an operation of the motor is controlled based on the rotation state of the rotary drum.

12. The flexible display device of claim 2, further comprising:
a rear protection cover removably attached to a rear surface of the display part and configured to cover an exposed rear surface of the display part.

13. The flexible display device of claim 12, wherein:
the rear protection cover is removably attachable to the display part by at least one magnet,
wherein the rear protection cover is detachable from the display part as the display part is being retracted into the casing.

14. A flexible display device for a vehicle, comprising:
a casing having an opening;
a display part configured to display information;
a display driver configured to move the display part into and out of the casing through the opening of the casing;
a display winder configured to wind and unwind the display part as the display driver moves the display part into and out of the casing, respectively, and
a guide part connected to an inside of the casing and configured to guide movement of the display part,
wherein, in the display part, an exposure range of the display part is controlled based on a rotation state of the rotary drum, and
wherein the guide part is configured to guide the display part along a path having a radius of curvature in a range of 30 mm to 70 mm.

15. The flexible display device of claim 14, wherein:
the guide part includes a curvature guide configured to guide movement of the display part along the path; and
the curvature guide includes a front curvature guide in contact with a front surface of the display part, and a rear curvature guide in contact with a rear surface of the display part.

16. The flexible display device of claim 15, wherein the front curvature guide and the rear curvature guide each includes a plurality of rollers.

17. A flexible display device for a vehicle, comprising:
a casing having an opening;
a display part configured display information;
a display driver configured to move the display part into and out of the casing through the opening of the casing; and
a display winder configured to wind and unwind the display part as the display driver moves the display part into and out of the casing;
wherein the display part includes a flexible plastic organic light-emitting diode (POLED) display, and
wherein the display winder includes a rotary drum having an outer circumferential surface on which the display part is wound and a sensor recognizer configured to detect a rotation state of the rotary drum,
wherein, in the display part, an exposure range of the display part is controlled based on the rotation state of the rotary drum, and
wherein:
the rotary drum includes a rotary spring; and
the rotary spring applies a force in a direction in which the display part is wound onto the rotary drum.

* * * * *